United States Patent
Wong et al.

(10) Patent No.: US 7,605,477 B2
(45) Date of Patent: Oct. 20, 2009

(54) STACKED INTEGRATED CIRCUIT ASSEMBLY

(75) Inventors: Tse E. Wong, Los Alamitos, CA (US); Samuel D. Tonomura, Rancho Palos Verdes, CA (US); Stephen E. Sox, La Canada, CA (US); Timothy E. Dearden, Torrance, CA (US); Clifton Quan, Arcadia, CA (US); Polwin C. Chan, Monterey Park, CA (US); Mark S. Hauhe, Hermosa Beach, CA (US)

(73) Assignee: Raytheon Company, Waltham, MA (US)

( * ) Notice: Subject to any disclaimer, the term of this patent is extended or adjusted under 35 U.S.C. 154(b) by 197 days.

(21) Appl. No.: 11/698,602

(22) Filed: Jan. 25, 2007

(65) Prior Publication Data

US 2008/0179758 A1    Jul. 31, 2008

(51) Int. Cl.
*H01L 23/48* (2006.01)
*H01L 23/52* (2006.01)

(52) U.S. Cl. .................. 257/777; 257/778; 257/686; 257/E23.021

(58) Field of Classification Search .............. 257/777, 257/686, 778, E23.021
See application file for complete search history.

(56) References Cited

U.S. PATENT DOCUMENTS

| | | | |
|---|---|---|---|
| 5,973,930 A * | 10/1999 | Ikeda et al. | 361/768 |
| 5,995,379 A * | 11/1999 | Kyougoku et al. | 361/803 |
| 6,239,495 B1 * | 5/2001 | Sakui et al. | 257/777 |
| 6,335,491 B1 * | 1/2002 | Alagaratnam et al. | 174/260 |
| 6,429,509 B1 | 8/2002 | Hsuan | |
| 6,717,251 B2 * | 4/2004 | Matsuo et al. | 257/686 |
| 6,728,432 B1 | 4/2004 | Tonomura et al. | |
| 6,861,288 B2 | 3/2005 | Shim et al. | |
| 6,891,239 B2 | 5/2005 | Anderson et al. | |
| 6,962,835 B2 | 11/2005 | Tong et al. | |
| 6,992,399 B2 | 1/2006 | Stewart | |
| 7,002,225 B2 | 2/2006 | Stewart | |
| 2003/0104649 A1 * | 6/2003 | Ozgur et al. | 438/50 |
| 2004/0155358 A1 * | 8/2004 | Iijima | 257/778 |
| 2006/0226527 A1 * | 10/2006 | Hatano et al. | 257/686 |
| 2007/0090532 A1 * | 4/2007 | Lehman | 257/777 |

* cited by examiner

*Primary Examiner*—Nitin Parekh
(74) *Attorney, Agent, or Firm*—Pillsbury Winthrop Shaw Pittman LLP

(57) ABSTRACT

A stacked integrated circuit assembly includes a substrate having a top surface with at least one substrate connection pad. A first flip chip integrated circuit (FFIC) is disposed above the substrate, and a second flip chip integrated circuit (SFIC) is disposed above the FFIC. The FFIC is disposed between the substrate and the SFIC. The stacked integrated circuit assembly includes least one solder connection between the substrate connection pad and the FFIC and at least one solder connection between the FFIC and the SFIC.

16 Claims, 3 Drawing Sheets

STACKED INTEGRATED CIRCUIT ASSEMBLY

FIELD

This invention relates generally to integrated circuits, and, in particular, to a stacked integrated circuit assembly.

BACKGROUND

Technological advances have enabled the integration of many electronic components into a single integrated circuit. For example, a modern integrated circuit may contain millions of transistors. Traditionally, an electronic circuit was constructed of a number of discrete electronic components such as discrete transistors. Each discrete electronic component was connected by electrical conductors such as wires or circuit board traces. Today, one or more electronic circuits may be integrated into a single integrated circuit. The integrated circuit contains each electronic circuit's electronic components as well as its connecting electrical conductors. Frequently, an integrated circuit contains many complex electronic circuits. Examples of integrated circuits include computer microprocessors and memory chips.

Implementing an electronic circuit using an integrated circuit may offer a number of advantages over implementing the electronic circuit using discrete electronic components. First, the electronic circuit may require significantly less space on a circuit board when implemented by an integrated circuit than when implemented by discrete parts. This space savings is possible because electronic components within an integrated circuit can be miniaturized and can be placed closer together than electronic components in a discrete electronic circuit.

Second, a given electronic circuit may exhibit superior electrical performance when implemented by an integrated circuit than when implemented by discrete parts. As was noted above, electronic components within an integrated circuit can be placed closer together than electronic components in a discrete electronic circuit. Placing electronic components closer together allows lengths of connecting electrical conductors to be reduced. Electrical conductors inherently possess parasitic elements such as resistance, inductance, and capacitance. Such parasitic elements are generally proportional to conductor length and often degrade electrical performance of the electronic circuit they are a part of. Consequently, decreasing separation between electronic components generally improves electrical performance of the electronic circuit.

Third, an electronic circuit may often be implemented more economically by using an integrated circuit rather than by using discrete parts. Although integrated circuits are generally expensive to design, they can generally be economically produced in large volumes using automated processes. Additionally, an installation of an integrated circuit on a circuit board generally requires placement of a single part. In contrast, an installation of an electronic circuit implemented with discrete parts on a circuit board generally requires placement of each discrete part.

Although great strides have been made in integrating electronic components into single integrated circuits, it is not always feasible to integrate all electronic components required in a given application into a single integrated circuit. By way of example, it may not be technically feasible to integrate all required electronic components into a single integrated circuit. One potential technical barrier to integration may be that a plurality of production processes are required to produce all of the required electronic components in a given application. If one or more of the production processes are not compatible with one or more of the other production processes, it may not be possible to integrate all of the electronic components into a single integrated circuit.

A second technical barrier to integrating all required electronic components into a single integrated circuit may be that certain electronic components do not operate properly when placed in close proximity to other electronic components. For example, a precision analog circuit may not operate properly when placed in close proximity to a digital circuit. Consequently, it may be impossible to integrate the analog circuit's electronic components and the digital circuit's electronic components into a common integrated circuit.

Although it may be technically feasible to integrate all electronic components of a given application into a single integrated circuit, it may not be economically feasible to do so. By way of example, integration may not be feasible if the production processes required for integration are prohibitively expensive. Another possible reason why integration may not be economically feasible is that there may not be sufficient demand for an integrated circuit to justify an investment required to design the integrated circuit.

There are many applications that require the use of two or more integrated circuits because it is not feasible to integrate all of the required electronic components into a single integrated circuit. However, many of these applications would benefit from the advantages associated with integrating all electronic components into a single integrated circuit. Examples include applications where circuit board space is limited or high frequency applications that require close spacing of electronic components. Consequentially, what is needed is an assembly that includes at least two integrated circuits but offers some of the advantages of an assembly having one integrated circuit.

SUMMARY

The stacked integrated circuit assembly and applications thereof herein disclosed advance the art and overcome at least one of the problems articulated above by providing an assembly including two stacked integrated circuits.

In particular, and by way of example only, according to one embodiment, a stacked integrated circuit assembly includes a substrate having a top surface with at least one substrate connection pad. A first flip chip integrated circuit (FFIC) is disposed above the substrate, and a second flip chip integrated circuit (SFIC) is disposed above the FFIC. The FFIC is disposed between the substrate and the SFIC. The stacked integrated circuit assembly includes at least one solder connection between the substrate connection pad and the FFIC and at least one solder connection between the FFIC and the SFIC.

According to another embodiment, a stacked integrated circuit assembly includes a substrate having a top surface and at least one substrate connection pad disposed upon the top surface. The stacked integrated circuit assembly includes a FFIC having (1) a FFIC front surface and opposite thereto a FFIC back surface, wherein the FFIC front surface is proximate to the substrate top surface, (2) at least one FFIC front connection pad disposed upon the FFIC front surface, wherein each FFIC front connection pad is aligned to at least one substrate connection pad, (3) at least one electrically conductive through die via, wherein each through die via is electrically coupled to one FFIC front connection pad and extends from the FFIC front surface to the FFIC back surface, (4) at least one FFIC back connection pad disposed upon the FFIC back surface, wherein each FFIC back connection pad is electrically coupled to one through die via, and (5) a die having a first semiconductor material. The stacked integrated circuit assembly includes a SFIC having (1) a SFIC front surface and opposite thereto a SFIC back surface, wherein the SFIC front surface is proximate to the FFIC back surface, (2) at least one SFIC front connection pad disposed upon the SFIC front surface, wherein each SFIC front connection pad is aligned to at least one FFIC back connection pad, and (3) a die having a second semiconductor material, wherein the second semiconductor material differs from the first semiconductor material. The stacked integrated circuit assembly includes a first solder connection between each FFIC front connection pad and each substrate connection pad, wherein the first solder connection establishes a first gap between the FFIC front surface and the substrate, and a second solder connection between each SFIC front connection pad and each FFIC back connection pad, wherein the second solder connection establishes a second gap between the SFIC front surface and the FFIC back surface. The stacked integrated circuit assembly is operable to process microwave frequency electrical signals.

In yet another embodiment, a method of producing an assembly having two stacked dice includes fabricating a first wafer having a plurality of first dice and fabricating a second wafer having a plurality of second dice. A first solder bump is applied to each of an at least one second die front connection pad disposed on a front surface of each second die. The second wafer is diced into a plurality of discrete second dice. A predetermined quantity of the discrete second dice are mounted onto the first wafer such that each second die front connection pad aligns with an at least one first die back connection pad disposed upon a back surface of each first die. Each first solder bump is melted. A second solder bump is applied to each of an at least one first die front connection pad disposed upon a front surface of each first die, and the first wafer is diced into a plurality of discrete first dice having a respective discrete second die coupled to each discrete first die.

DETAILED DESCRIPTION

Before proceeding with the detailed description, it is to be appreciated that the present teaching is by way of example only, not by way of limitation. The concepts herein are not limited to use or application with a specific type of stacked integrated circuit assembly. Thus, although the instrumentalities described herein are for the convenience of explanation, shown and described with respect to exemplary embodiments, it will be appreciated that the principles herein may be applied equally in other types of stacked integrated circuit assemblies.

Figure 1:
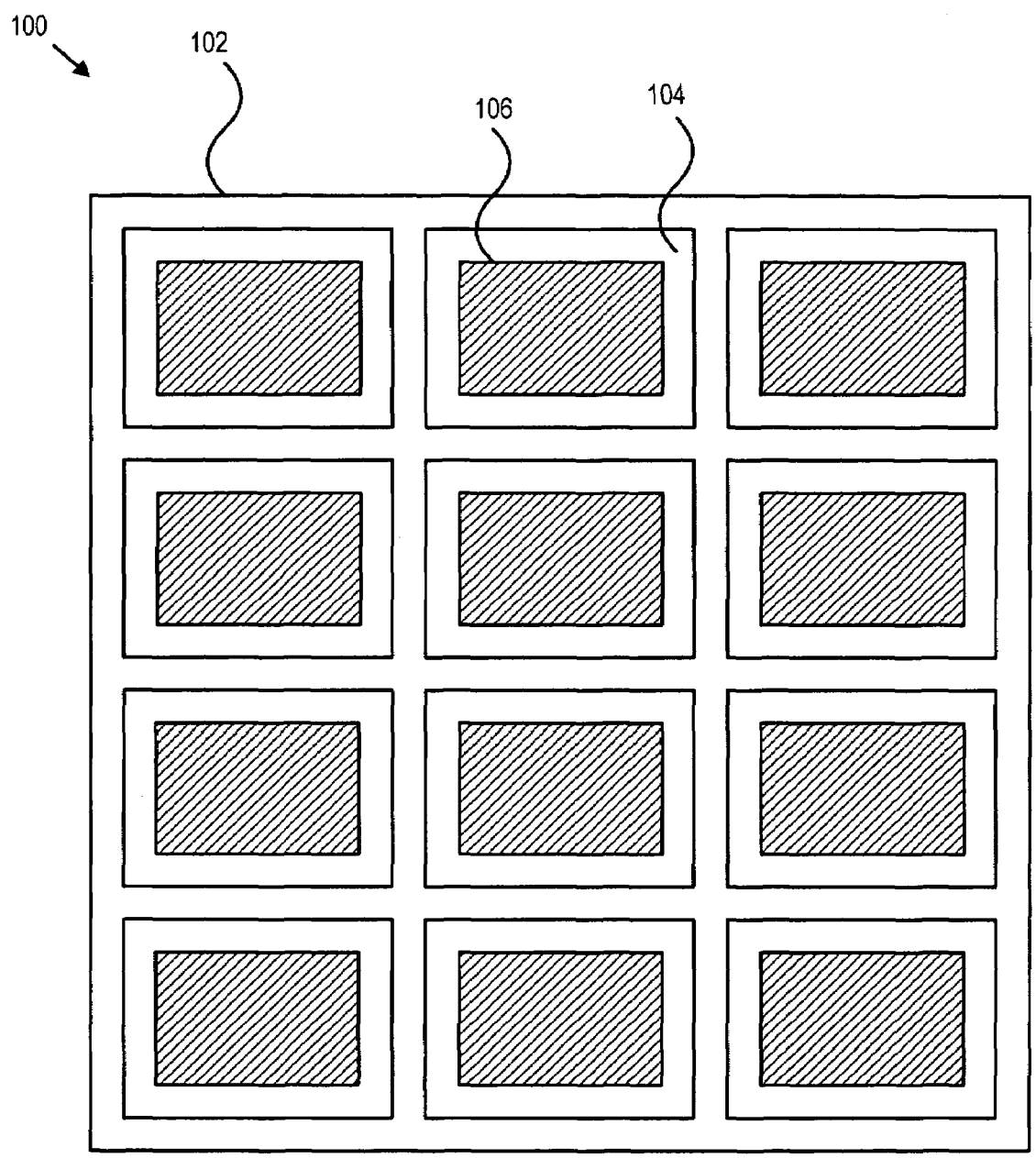
FIG. 1 is a top plan view of an array of transmit/receive modules, according to an embodiment.

FIG. 1 is a top plan view of array 100 of transmit/receive modules 106 for use in a microwave system. Array 100 illustrates an application of the stacked integrated circuit assembly. Each transmit/receive module 106 is an exemplary embodiment of the stacked integrated circuit assembly. However, other embodiments of the stacked integrated circuit assembly are possible.

Array 100 is used to send and/or receive electromagnetic signals. A radiating element (not shown) is coupled to each transmit/receive module 106. The radiating element may convert an electrical signal to an electromagnetic signal and radiate the electromagnetic signal. Conversely, the radiating element may also capture an electromagnetic signal and convert it to an electrical signal.

One transmit/receive module 106 is electrically coupled to each radiating element. The transmit/receive module 106 receives a transmit signal from an external subsystem and converts the transmit signal to an electrical signal that can be utilized by the radiating element. For example, the transmit/receive module 106 may receive an analog or digital communication signal from the external subsystem and convert it to a high frequency electrical signal that can be utilized by the radiating element.

The transmit/receive module 106 also receives an electrical signal generated by the radiating element in response to its capture of an electromagnetic signal. The transmit/receive module 106 converts the electrical signal generated by the radiating element to a receive signal that can be utilized by an external subsystem. For example, the transmit/receive module 106 may convert a high frequency electrical signal it receives from the radiating element to an analog or digital communication signal that may be utilized by a communication subsystem.

Array 100 includes lattice 102 having a plurality of cells 104. Each transmit/receive module 106 includes two flip chip integrated circuits (not shown) stacked on a substrate (not shown). Such stacking reduces the footprint of transmit/receive module 106, allowing transmit/receive module 106 to fit within cell 104 of lattice 102. Because the size of each cell 104 is inversely proportional to the operating frequency of array 100, the size of each cell 104 may be relatively small if array 100 operates at high frequencies.

Figure 2:
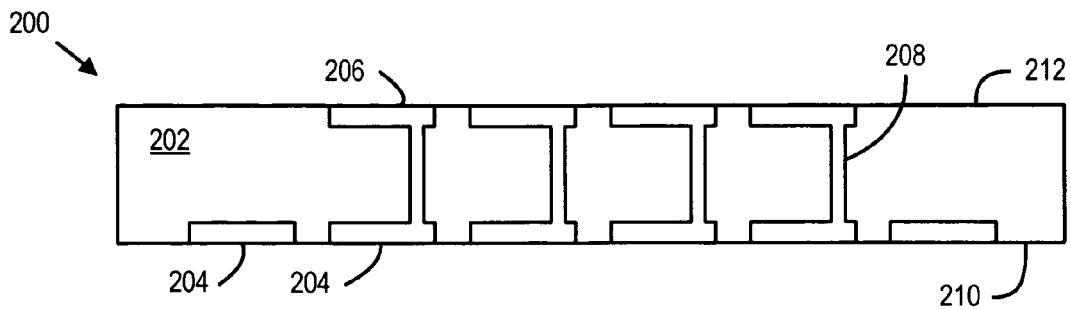
FIG. 2 is a cross-sectional side view of a flip chip integrated circuit, according to an embodiment.

FIG. 2 is a cross-sectional side view of flip chip integrated circuit 200. Flip chip integrated circuit 200 is part of the stacked integrated circuit assembly, which will be discussed in more detail with respect to FIG. 3. Flip chip integrated circuit 200 may process microwave frequency electrical signals, wherein microwave frequency ranges from 300 MHz to 300 GHz. In an embodiment, flip chip integrated circuit 200 is constructed using commercially available packaging technology intended for lower frequency digital circuits, yet, flip chip integrated circuit 200 is operable to process microwave frequency electrical signals.

Flip chip integrated circuit 200 has die 202 comprising front surface 210 and back surface 212. Die 202 may include a first semiconductor material. Front connection pads 204 are disposed along front surface 210. Front connection pads 204, which are constructed of an electrically conductive material, are electrically coupled to electrical subsystems within die 202 and/or to through die vias 208. Consequently, front connection pads 204 provide electrical access to die 202 and to through die vias 208. Front connection pads 204 may also be used to electrically couple flip chip integrated circuit 200 to a substrate, such as a printed circuit board.

Through die vias 208 are constructed of an electrically conductive material and extend through die 202 from front surface 210 to back surface 212. Thus, through die vias 208 provide an electrical path through die 202. Through die vias 208 may be plated with an electrically conductive material and/or may be filled with an electrically conductive material. For example, through die vias 208 may be plated or filled with solid copper. In an embodiment, deep reactive ion etching combined with a wafer thinning technique can be used to create through die vias 208 having diameters of four (4) mils when die 202 is sixteen (16) mils thick.

As shown in FIG. 2, each through die via 208 electrically couples at least one front connection pad 204 to at least one back connection pad 206. Back connection pads 206, which are constructed of an electrically conductive material, are disposed along back surface 212. Thus, through die vias 208 allow flip chip integrated circuit 200 to couple electrical signals from front surface 210 to back surface 212.

Figure 3:
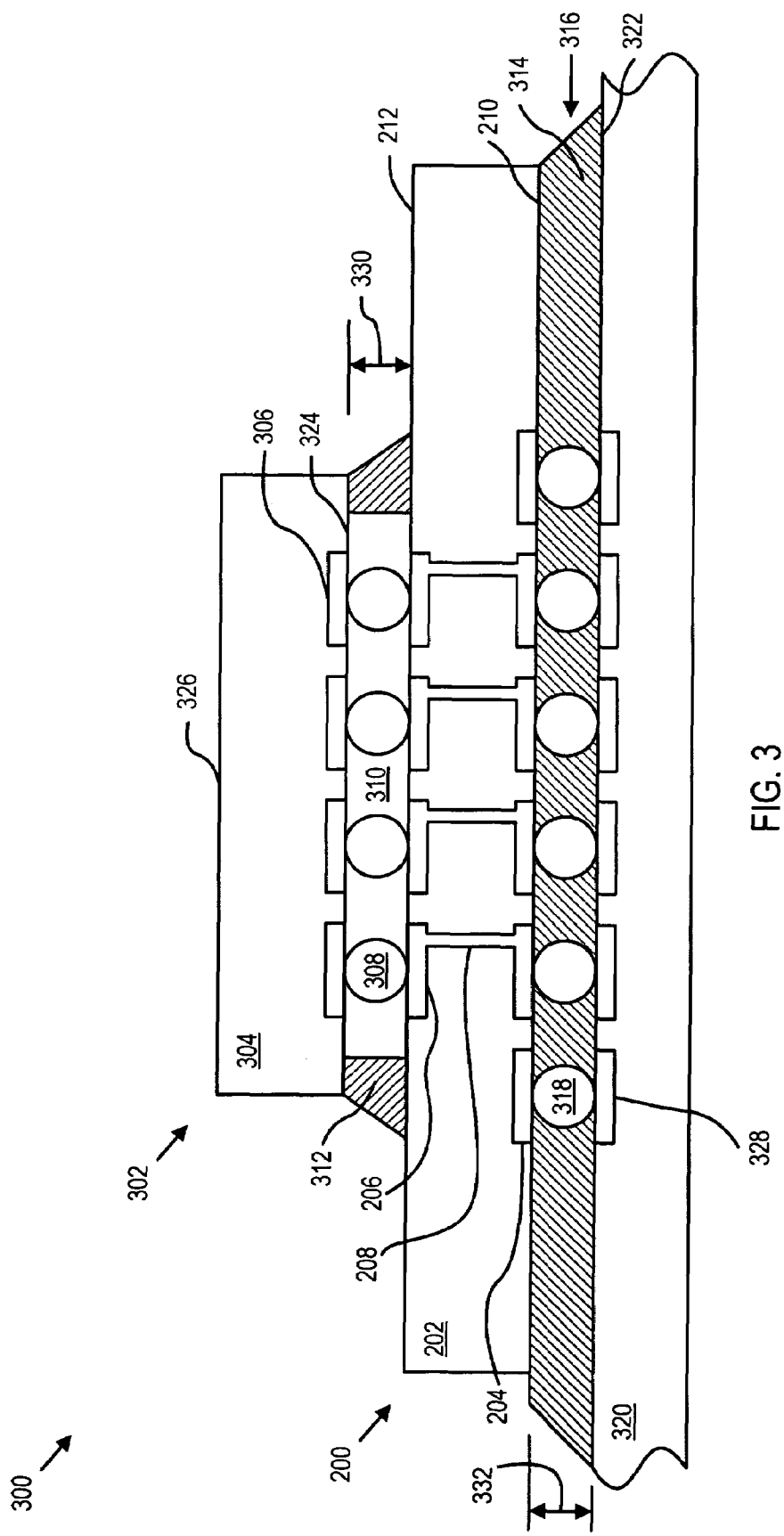
FIG. 3 is a cross-sectional side view of a stacked integrated circuit assembly, according to an embodiment.

Flip chip integrated circuit 200 is shown in FIGS. 2 and 3 using a via off-pad design. In the via off-pad design, front connection pads 204 and back connection pads 206 are disposed adjacent to the through die via that connects both connection pads. In other words, each front connection pad 204 and each back connection pad 206 are not co-located with their respective through die vias 208. In contrast, in an integrated circuit not using the via off-pad design (not shown), each connection pad would be disposed immediately above or below a via.

The via off-pad design offers a number of advantages over designs wherein vias are co-located with connection pads. First, the via off-pad design reduces a thermal mass of the connection pads. Consequently, the via off pad design facilitates high quality solder connections to connection pads, thereby improving thermal cycling reliability.

Second, because a via is not co-located with a connection pad in the via off-pad design, the via's diameter may be made larger. A larger diameter via facilitates the filling and/or plating of the via which may improve the via's electrical performance.

Third, the flatness of a filled via is not critical in a via off-pad design. Consequently, use of the via off-pad design may decrease manufacturing costs because the flatness of a filled via does not have to be tightly controlled during a manufacturing process of the integrated circuit.

FIG. 3 is a cross-sectional side view of stacked integrated circuit assembly 300. Assembly 300 includes flip chip integrated circuit 200, flip chip integrated circuit 302, and substrate 320.

Substrate 320 provides mechanical support for flip chip integrated circuit 200. Additionally, substrate 320 has conductive areas or substrate connection pads 328, which are disposed along substrate top surface 322. Substrate connection pads 328 are constructed of an electrically conductive material. In an embodiment, substrate 320 may be a printed circuit board, and substrate connection pads 328 may be electrically coupled to electrical traces in the printed circuit board and/or on the printed circuit board.

Flip chip integrated circuit 200 is coupled to substrate 320 by first solder connections 318. First solder connections 318, which may be reflowed solder balls or solder bumps, electrically couple substrate connection pads 328 to front connection pads 204. First gap 316 between substrate 320 and flip chip integrated circuit 200 may be fully or partially filled with underfill material 314. Underfill material 314 negates the effect of differences in the coefficient of thermal expansion between substrate 320 and flip chip integrated circuit 200. In an embodiment, underfill material 314 may be an epoxy material.

Flip chip integrated circuit 302 includes die 304 with front surface 324 and back surface 326. Die 304 may include a second semiconductor material. In an embodiment, the second semiconductor material is different from the first semiconductor material of die 202. Flip chip integrated circuit 302 may be capable of processing microwave frequency electrical signals. In an embodiment, flip chip integrated circuit 302 may be constructed using commercially available packaging technology intended for low frequency digital circuits, yet, flip chip integrated circuit 302 is operable to process microwave frequency electrical signals.

Front connection pads 306, which are constructed of an electrically conductive material, are disposed along front surface 324. Each front connection pad 306 is electrically coupled to one or more subsystems within die 304. Thus, front connection pads 306 provide electrical access to die 304.

Flip chip integrated circuit 302 is coupled to back surface 212 of flip chip integrated circuit 200 by second solder connections 308. Second solder connections 308 may be reflowed solder balls or solder bumps. Second solder connections 308 may have a higher melting temperature than first solder connections 318 in order to allow first solder connections 318 to be melted without melting second solder connections 308. Such difference in melting temperatures may be desirable if flip chip integrated circuit 302 is to be coupled to flip chip integrated circuit 200 before first solder connections 318 are to be applied or melted.

Second gap 310 is located between flip chip integrated circuit 200 and flip chip integrated circuit 302. Front surface 324 of flip chip integrated circuit 302 may be about parallel to back surface 212 of flip chip integrated circuit 200. Thickness 332 of first gap 316 may be about the same as thickness 330 of second gap 310.

Underfill material 312 may be located within some or all of second gap 310. In an embodiment, underfill material 312 may be an epoxy material. If the difference in the coefficient of thermal expansion between flip chip integrated circuit 200 and flip chip integrated circuit 302 is sufficiently small, it may be desirable to place underfill material 312 only around the perimeter of second gap 310, as shown in FIG. 3. Such limited use of underfill material 312 will keep foreign substances out of second gap 312. Limited application of underfill material 312 may be desirable if flip chip integrated circuit 302 responds poorly to underfill material 312. For example, flip chip integrated circuit 302 may have die 304 including gallium and arsenic. A die including gallium and arsenic experiences performance degradation when exposed to underfill material. Thus, it is desirable to minimize use of underfill material with a die including gallium and arsenic.

It should be noted that use of underfill is required when a die including gallium and arsenic is mounted directly on an organic printed circuit board. The use of underfill material is required in this application due to the significant mismatch in the coefficient of thermal expansion between the die including gallium and arsenic and the printed circuit board. However, as noted above, the coefficient of thermal expansion between flip chip integrated circuit 200 and flip chip integrated circuit 302 may be sufficiently small such that the use of underfill material in gap 310 is not required. Thus, the use of assembly 300 may allow a die including gallium and arsenic to be used with a printed circuit board without the use of underfill material.

Because flip chip integrated circuit 200 is electrically coupled to substrate 320 and to flip chip integrated circuit 302, flip chip integrated circuit 200 may serves as a microwave frequency electrical interconnect between substrate 320 and flip chip integrated circuit 302. Electrical signals and electric power may be transmitted from substrate 320 to flip chip integrated circuit 302 and vice versa by first solder connections 318, front connection pads 204, through die vias 208, back connection pads 206, and second solder connections 308. Second solder connections 308 also allow flip chip integrated circuit 200 to be directly electrically coupled to flip chip integrated circuit 302. Consequently, the two integrated circuits of stacked integrated circuit assembly 300 are tightly electrically coupled. Therefore, the use of stacked integrated circuit assembly 300 may mitigate performance degradation associated with not integrating all electronic circuit components in a single integrated circuit.

Although stacked integrated circuit assembly 300 includes two integrated circuits, assembly 300 only requires an amount of substrate surface area corresponding to a single integrated circuit. Such small footprint may be desirable in applications where space is at a premium, such as array 100 of FIG. 1.

In an embodiment, flip chip integrated circuit 200 and/or flip chip integrated circuit 302 are monolithic microwave integrated circuits. In another embodiment, flip chip integrated circuits 200 and 302 are monolithic microwave integrated circuits that cooperate with substrate 320 to act as a transmit/receive module. The transmit/receive module may be electrically coupled to a radiating element.

The short connections between substrate 320 and flip chip integrated circuit 200 as well as between flip chip integrated circuit 200 and flip chip integrated circuit 302 may enable stacked integrated circuit assembly 300 to have good high frequency performance characteristics. In an embodiment, stacked integrated circuit assembly 300 may be operable to process microwave frequency electrical signals.

In an embodiment, die 202 and die 304 include different semiconductor materials. Die 202 may include silicon and germanium, and die 304 may include gallium and arsenic. In an embodiment, flip chip integrated circuit 200 may include analog and digital functionality, and flip chip integrated circuit 302 may include analog functionality. For example, flip chip integrated circuit 200 may include phase and amplitude control functionality, and flip chip integrated circuit 302 may include amplification functionality.

Figure 4:
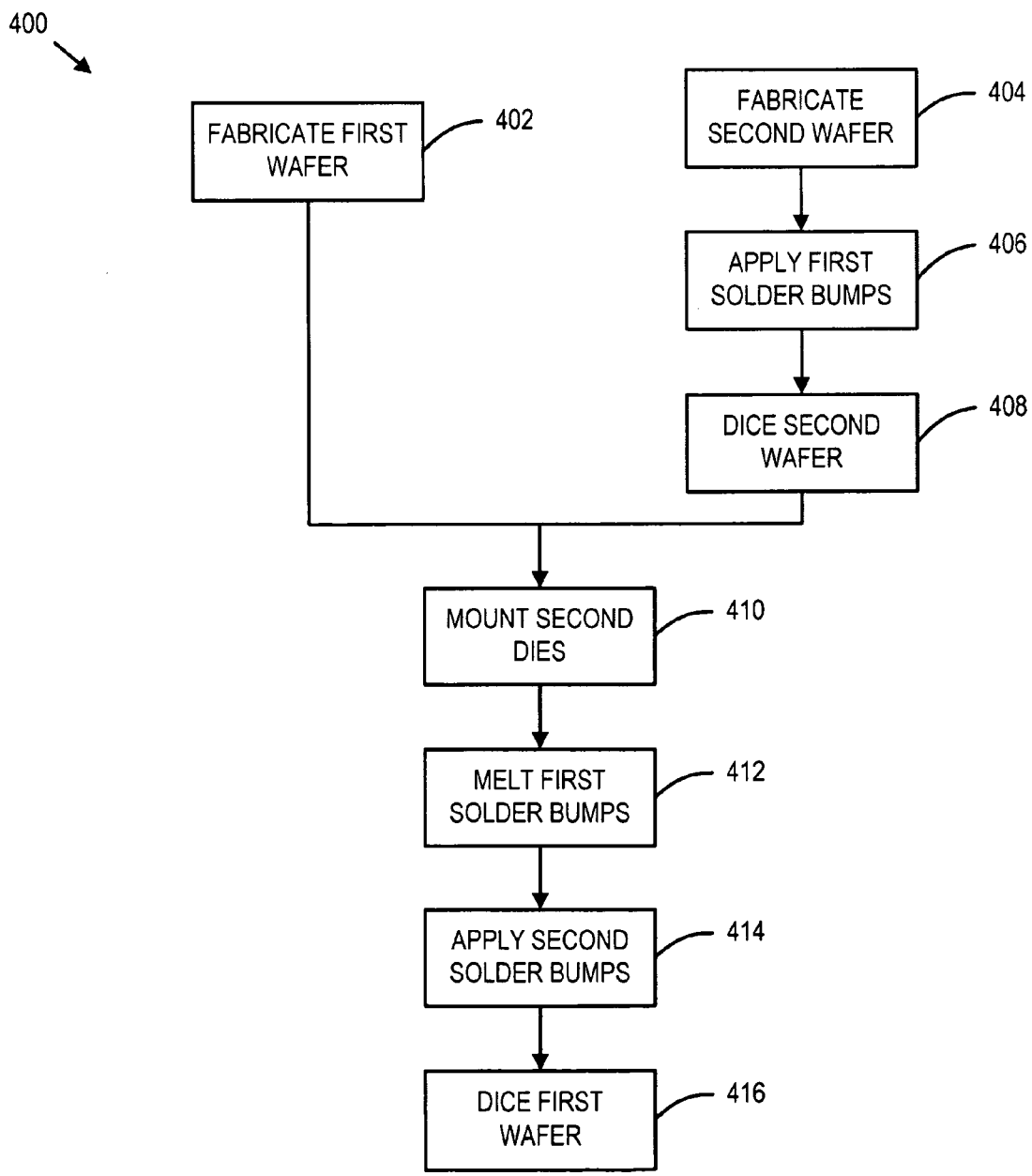
FIG. 4 is a flow chart of method of producing an assembly having two stacked dice, according to an embodiment.

FIG. 4 is a flow chart of method 400 of producing an assembly having two stacked dice. In an embodiment, method 400 may be used to partially construct stacked integrated circuit assembly 300 of FIG. 3.

Method 400 may begin with step 402 wherein a first wafer is fabricated. The first wafer includes a plurality of first dice, each first die having a front surface and opposite thereto a back surface. By way of example and not of limitation, each first die may be die 202 of FIGS. 2 and 3. As was discussed with respect to FIGS. 2 and 3, each first die may include a monolithic microwave integrated circuit and/or at least one electrically conductive through die via. Each through die via may couple a front connection pad disposed on the front surface to a back connection pad disposed on the back surface.

Steps 404, 406, and 408 may be carried out before, after, or during step 402. In step 404, a second wafer is fabricated. The second wafer includes a plurality of second dice, each second die having a front surface and a back surface. By way of example and not of limitation, each second die may be die 304 of FIG. 3. As was discussed with respect to FIG. 3, each second die may comprise a monolithic microwave integrated circuit.

In step 406, a first solder bump is applied to each front connection pad disposed on the front surface of each second die. In step 408, the second wafer is diced into a plurality of discrete second dice.

Steps 402 and 408 proceed to step 410. In step 410, a predetermined quantity of discrete second dice are mounted on the first wafer, such that each front connection pad of each discrete second die aligns with at least one back connection pad of a first die. In step 412, each first solder bump is melted or reflowed such that each of the predetermined quantity of discrete second dice are electrically coupled to the first wafer.

In step 414, a second solder bump is applied to each front connection pad disposed on the front surface of each first die. Finally, in step 416, the first wafer is diced into a plurality of discrete first dice, each discrete first die having a discrete second die attached to its back surface.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A stacked integrated circuit assembly, comprising:
    a substrate having a top surface with at least one substrate connection pad;
    a first flip chip integrated circuit (FFIC) disposed above the substrate;
    a second flip chip integrated circuit (SFIC) disposed above the FFIC, the FFIC disposed between the substrate and the SFIC;
    a first solder connection between the substrate connection pad and the FFIC; and
    a second solder connection between the FFIC and the SFIC,
    wherein a first melting temperature of the first solder connection is different than a second melting temperature of the second solder connection and wherein connection pads of the FFIC, the SFIC and the substrate are coplanar with respective surfaces of the FFIC, the SFIC and the substrate, the respective surfaces each face corresponding solder connections.

2. The assembly of claim 1, wherein the FFIC comprises a die having a first semiconductor material, and the SFIC comprises a die having a second semiconductor material, the second semiconductor material differing from the first semiconductor material.

3. The assembly of claim 1, wherein the assembly is operable to process microwave frequency electrical signals.

4. A stacked integrated circuit assembly, comprising:
    a substrate having a top surface, and at least one substrate connection pad disposed upon the top surface;
    a first flip chip integrated circuit (FFIC), the FFIC comprising:
        a FFIC front surface and opposite thereto a FFIC back surface, the FFIC front surface proximate to the substrate top surface;
        at least one FFIC front connection pad disposed upon the FFIC front surface, each FFIC front connection pad aligned to at least one substrate connection pad;
        at least one electrically conductive through die via, each through die via electrically coupled to one FFIC front connection pad and extending from the FFIC front surface to the FFIC back surface;
        at least one FFIC back connection pad disposed upon the FFIC back surface, each FFIC back connection pad electrically coupled to one through die via; and
        a die having a first semiconductor material;
    a second flip chip integrated circuit (SFIC), the SFIC including:
        a SFIC front surface and opposite thereto a SFIC back surface, the SFIC front surface proximate to the FFIC back surface;

at least one SFIC front connection pad disposed upon the SFIC front surface, each SFIC front connection pad aligned to at least one FFIC back connection pad; and a die having a second semiconductor material, the second semiconductor material differing from the first semiconductor material;

a first solder connection between each FFIC front connection pad and each substrate connection pad, the first solder connection establishing a first gap between the FFIC front surface and the substrate; and a second solder connection between each SFIC front connection pad and each FFIC back connection pad, the second solder connection establishing a second gap between the SFIC front surface and the FFIC back surface; and wherein the assembly is operable to process microwave frequency electrical signals wherein a first melting temperature of the first solder connection is lower than a second melting temperature of the second solder connection and wherein the connection pads of the FFIC, the SFIC and the substrate are coplanar with the front and the back surfaces of the FFIC, the front surface of the SFIC and the top surface of the substrate respectively.

5. The assembly of claim 4, wherein the first semiconductor material comprises silicon and germanium, and the second semiconductor material comprises gallium and arsenic.

6. The assembly of claim 4, wherein the FFIC and the SFIC comprise monolithic microwave integrated circuits.

7. The assembly of claim 4, wherein the substrate comprises a printed circuit board.

8. The assembly of claim 4, wherein each through die via is plated with an electrically conductive material.

9. The assembly of claim 4, wherein each through die via is filled with an electrically conductive material.

10. The assembly of claim 4, wherein each FFIC front connection pad is positioned adjacent to the through die via that the FFIC front connection pad is electrically coupled to.

11. The assembly of claim 4, wherein each FFIC back connection pad is positioned adjacent to the through die via that the FFIC back connection pad is electrically coupled to.

12. The assembly of claim 4 further comprising a first underfill material positioned in the first gap.

13. The assembly of claim 4 further comprising a second underfill material positioned in a subset of the second gap.

14. The assembly of claim 4, wherein the FFIC is positioned about parallel to the SFIC.

15. The assembly of claim 4, wherein the FFIC is positioned about parallel to the substrate.

16. The assembly of claim 4, wherein a first thickness of the first gap is about equal to a second thickness of the second gap.

* * * * *